United States Patent [19]
Thomas

[11] Patent Number: 6,052,268
[45] Date of Patent: Apr. 18, 2000

[54] ELECTRICAL APPARATUS

[75] Inventor: Kevin Paul Thomas, Cheltenham, United Kingdom

[73] Assignee: Smiths Industries Public Limited Company, London, United Kingdom

[21] Appl. No.: 09/202,191

[22] PCT Filed: Jul. 3, 1997

[86] PCT No.: PCT/GB97/01792

§ 371 Date: Aug. 18, 1999

§ 102(e) Date: Aug. 18, 1999

[87] PCT Pub. No.: WO98/02963

PCT Pub. Date: Jan. 22, 1998

[30] Foreign Application Priority Data

Jul. 11, 1996 [GB] United Kingdom ............... 9614590

[51] Int. Cl.$^7$ ........................................ H02H 5/04
[52] U.S. Cl. ............................ 361/103; 361/93.8
[58] Field of Search ..................... 361/103, 104, 361/105, 93.1, 93.8, 78, 87

[56] References Cited

U.S. PATENT DOCUMENTS

| | | | |
|---|---|---|---|
| 4,727,450 | 2/1988 | Fachinetti et al. | 361/103 |
| 5,854,731 | 12/1998 | Thomas | 361/93.1 |

*Primary Examiner*—Michael J. Sherry
*Attorney, Agent, or Firm*—Pollock, Vande Sande & Amernick

[57] ABSTRACT

A semiconductor switch die (30) is mounted on one face of a substrate (31) and has a temperature sensor (10) on the opposite face to monitor the temperature in the vicinity of the semiconductor die. A current sensor (4) and voltage sensor (5) supply signals to a processor (15) to calculate power dissipated by the semiconductor device. The processor calculates the temperature of the device itself from the measured temperature and the dissipated power. If this exceeds a preset limit, the switching device is opened to prevent damage.

4 Claims, 1 Drawing Sheet

ELECTRICAL APPARATUS

This invention relates to electrical apparatus of the kind including a semiconductor switching device, an arrangement that derives a measure of power dissipated by said device, a sensor that provides a measure of the temperature in the vicinity of the device, and means to restrict flow of current through the device in response to a combination of the measure of power and the measure of temperature.

The usual way of protecting electrical equipment and its wiring from current overloads is by means of an electromagnetic relay switch, thermal wire fuse or electrothermal circuit breaker. These previous arrangements, however, are usually relatively heavy and bulky. They also have a slow response time and can be unreliable in the long term. Because of this, there is a move towards using solid state power controllers (SSPC) employing power semiconductors, to switch electrical energy to a load and to interrupt current flow should an overload be detected.

The advantages of solid state controllers over electromechanical counterparts are well recognised and typically include factors such as reduced weight, reduced time to respond, increased lifetime and increased reliability.

Despite these advantages, using power semiconductors in such a role does require a great deal of care because of the adverse effect of high temperatures on semiconductor devices. The maximum temperature for devices made of silicon is about 175° C. and for semiconductors made of silicon carbide it is about 400° C. In current limiting SSPC's, the power density within each die may exceed 500 W for short periods, resulting in rapid heating of the die and surrounding area.

In U.S. Pat. No. 4,937,697 there is described a circuit for protecting an FET device. The circuit employs a reference circuit to provide an indication of temperature of the device so that increased current can be supplied to the device when it has a low temperature.

It is an object of the present invention to provide apparatus for use in power switching and a method of controlling switching of a circuit protection device.

According to one aspect of the present invention there is provided electrical apparatus of the above-specified kind, characterised in that the apparatus includes a processor that calculates the resultant heat gain and heat loss of the semiconductor device over a period of time at a plurality of different nodes within the device, that the processor calculates the temperature of the device at a plurality of different nodes in the device at the end of that time, and that the apparatus restricts flow of current through the device if the calculated temperature of the node with the highest calculated temperature exceeds a predetermined temperature.

The apparatus preferably restricts current flow through the device by opening the device. The semiconductor switching device preferably comprises a semiconductor die mounted on one side of a substrate, the temperature sensor being mounted on the opposite side of the substrate According to another aspect of the present invention there is provided a method of protecting a semiconductor circuit protection device comprising the steps of measuring the temperature in the vicinity of the device, determining the power dissipated by the device, determining the temperature of the semiconductor device from the power dissipated by the device and the measured temperature in the vicinity of the device, comparing the determined temperature with a maximum permitted temperature, and restricting current flow through device if the maximum permitted temperature is exceeded, characterised in that the resultant heat gain and heat loss of the semiconductor device is calculated over a period of time at a plurality of different nodes within the device, that the temperature of the device at a plurality of different nodes in the device is calculated at the end of that time, and that the flow of current through the device is restricted if the calculated temperature of the node with the highest calculated temperature exceeds a predetermined temperature.

Electrical apparatus and its method of operation, in accordance with the present invention will now be described, by way of example, with reference to the accompanying drawings, in which.

Figure 1:
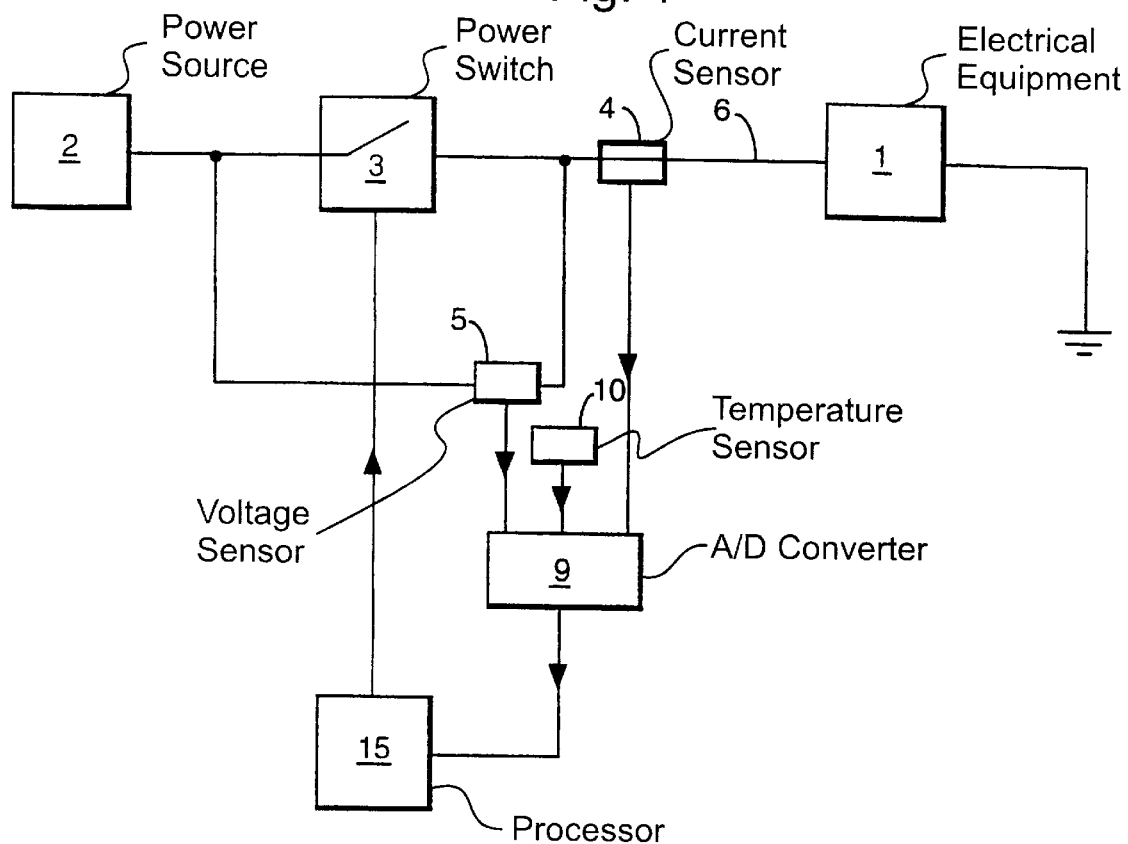
FIG. 1 illustrates the apparatus schematically.
Figure 2:
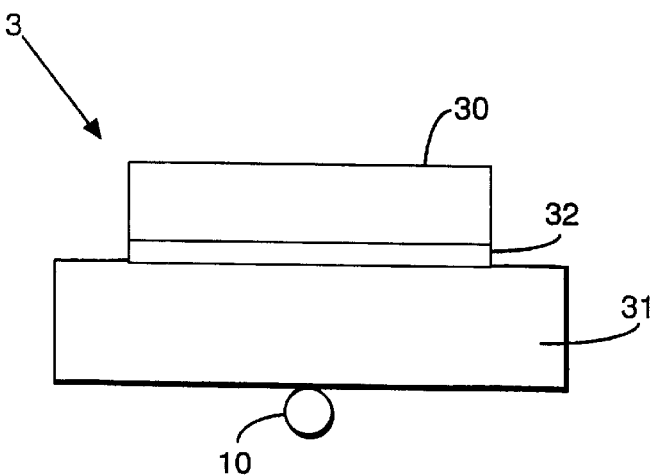
FIG. 2 is a side elevation view of the semiconductor device in more detail.

The apparatus includes electrical equipment 1 and associated wiring 6 connected to a power source 2 via a solid state semiconductor device in the form of a power switch 3. The power switch 3 comprises a semiconductor die 30 secured to the top of a base substrate 31 by means of a bond layer 32. The substrate 31 may be arranged to act as a heat sink. The die 30 includes various electronic junctions used to prevent or enable current flow through the switch 3. The switch 3 is encapsulated in the usual way. A current sensing device 4 supplies a signal proportional to the current flowing through the power switch 3 and this is converted to a convenient digital form by means of an analogue-to-digital converter 9 at an appropriate regular sampling rate. A voltage sensing device 5 supplies a signal proportional to the voltage across the power switch 3, this being converted to digital form by the analogue-to-digital converter 9.

A temperature sensing device 10 is mounted by means of an adhesive, or the like, to the underside of the base substrate 31 and supplies a signal proportional to the temperature of the power switch 3. The temperature sensor 10 cannot be mounted directly at the semiconductor junction, which is the region most susceptible to excessive temperature, so it only provides a temperature signal representative of the temperature in the vicinity of the relevant part of the device. This temperature signal is converted to digital form by means of the analogue-to-digital converter 9.

The analogue-to-digital converter 9 could be implemented as three separate devices or as a single analogue-to-digital converter with a multiplexing arrangement to enable more than one signal to be converted. Each output sample of the analogue-to-digital converter 9 is used as a new data input to a processor 15, which calculates the temperature at the junction of the semiconductor die 30 from the power dissipated in the switch 3 and the temperature in the vicinity of the junction, as indicated by the output of the temperature sensor 10. More particularly, the processor 15 carries out the following steps in turn for each new data value:

1. Calculate the gross power dissipation within the solid state semiconductor switch 3 as a function consisting of the product of the digital representation of the current flowing through the power switch 3 and the digital representation of the voltage across the switch 3. It may be convenient to use a look-up table to perform this calculation or to scale the inputs or result using an appropriate scaling factor.
2. With the digital value representing gross power dissipation used as an input, calculations conforming to equation 1 are now performed:

$$T_i^{p+1} = \left(q_i + \sum_j \frac{T_j^p}{R_{ij}}\right)\frac{\Delta t}{C_i} + \left(1 - \frac{\Delta t}{C_i}\sum_j \frac{1}{R_{ij}}\right)T_i^p \quad (1)$$

where

T is the calculated temperature of the node.

$q_i$ is the power delivered to node.

$R_{ij}$ is the thermal resistance between two adjoining nodes.

$C_i$ is the value of thermal capacitance for the node.

$\Delta t$ is time step.

p+1 is the index indicating the predicted temperature at the end of the time step.

p is the index indicating the temperature calculated for the previous time step.

The node of interested is designated with the subscript "j" and the adjoining node with the subscript "i"

The semiconductor structure is decomposed into a matrix of volume elements, where each volume element can be viewed as a node which is connected by thermal resistance's to its adjoining neighbours.

Global assembly of equations conforming to Equation (1) are used to estimate the temperature of the semiconductor switch at discrete points in its structure. At a suitable point in the semiconductor nodal decomposition the calculated temperature $T_j^P$ is substituted by the converted value of temperature given by the temperature sensing device, thus providing a reference temperature of the ambient temperature conditions.

3. Compare the node with the maximum temperature to the maximum permitted temperature.

4. Command the semiconductor protection device 3 to open, halting current flow to the electrical load 1 if the node with the maximum temperature exceeds the permitted temperature.

The above method estimates the maximum temperature of the junction of the semiconductor protection device structure using the finite difference technique. Alternatively, the method of temperature estimation could be implemented using the finite element or transmission line matrix techniques.

The processor 15 could be a microprocessor or microcontroller. Alternatively, the processor could be implemented by dedicated or programmed logic devices connected in a circuit.

Although the above techniques can function satisfactorily, because they operate iteratively, the accuracy and continuous nature of its operation is dependant on the program execution time. Depending upon circumstances, it may be necessary to implement an additional control mechanism to the semiconductor protection device 3 to limit damage in the event of very high current. Similarly, depending upon circumstances, it may be desirable to input information from other sensors or information via a suitable interface, which the processor will consider to modify its control to the semiconductor switching device. An example of this would be a temperature sensor strategically located next to the load, which could be used to modify the amount of power supplied to the load in the event that the load temperature exceeds pre-set limits. An alternative example would be information from another controller.

When an excess temperature is detected, it may not be necessary in every application to open the semiconductor switch 3 in order to protect, since it is only necessary to restrict power dissipated by the device to a safe level. This could be done by reducing the current, such as by connecting a resistive component in shunt with the device, by removing some of the load, by using the semiconductor switch to limit the current, or by other means. Alternatively, the current flow through the device could be completely prevented by opening some other switch, or fuse, in series with the semiconductor devices.

It may also be desirable for the processor to be provided with a suitable interface to communicate information known to it to external systems for more comprehensive system control. Such information, for example, may include present current flow, voltage across the semiconductor protection device, power dissipated within the protection device, and status: on, off, tripped.

I claim:

1. Electrical apparatus including a semiconductor switching device (30), an arrangement (4, 5, 9, 15) that derives a measure of power dissipated by said device, a sensor (10) that provides a measure of the temperature in the vicinity of the device, and means to restrict flow of current through the device (3) in response to a combination of the measure of power and the measure of temperature, characterised in that the apparatus includes a processor (15) that calculates the resultant heat gain and heat loss of the semiconductor device (30) over a period of time at a plurality of different nodes within the device (30), that the processor (15) calculates the temperature of the device at a plurality of different nodes in the device at the end of that time, and that the apparatus restricts flow of current through the device if the calculated temperature of the node with the highest calculated temperature exceeds a predetermined temperature.

2. Electrical apparatus according to claim 1, characterised in that the apparatus restricts current flow through the device by opening the device (30).

3. Electrical apparatus according to claim 1 or 2, characterised in that the semiconductor switching device comprises a semiconductor die (30) mounted on one side of a substrate (31), and that the temperature sensor (10) is mounted on the opposite side of the substrate.

4. A method of protecting a semiconductor circuit protection device (30) comprising the steps of measuring the temperature in the vicinity of the device, determining the power dissipated by the device (30), determining the temperature of the semiconductor device from the power dissipated by the device and the measured temperature in the vicinity of the device, comparing the determined temperature with a maximum permitted temperature, and restricting current flow through device if the maximum permitted temperature is exceeded, characterised in that the resultant heat gain and heat loss of the semiconductor device (30) is calculated over a period of time at a plurality of different nodes within the device (30), that the temperature of the device at a plurality of different nodes in the device is calculated at the end of that time, and that the flow of current through the device is restricted if the calculated temperature of the node with the highest calculated temperature exceeds a predetermined temperature.

* * * * *